United States Patent
Motoyui

(10) Patent No.: US 7,888,995 B2
(45) Date of Patent: Feb. 15, 2011

(54) DIFFERENTIAL AMPLIFIER CIRCUIT HAVING OFFSET ADJUSTMENT CIRCUIT

(75) Inventor: Toshiaki Motoyui, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/385,881

(22) Filed: Apr. 22, 2009

(65) Prior Publication Data

US 2009/0289713 A1    Nov. 26, 2009

(30) Foreign Application Priority Data

May 20, 2008    (JP)    ............................. 2008-131728

(51) Int. Cl.
*H03F 1/02*    (2006.01)
(52) U.S. Cl. .......................................... 330/9; 330/253
(58) Field of Classification Search ............... 330/9, 330/253, 257, 51, 261
See application file for complete search history.

(56) References Cited

U.S. PATENT DOCUMENTS

| | | | | |
|---|---|---|---|---|
| 6,388,521 | B1 * | 5/2002 | Henry | 330/258 |
| 6,586,990 | B2 * | 7/2003 | Udo et al. | 330/9 |
| 6,696,894 | B1 * | 2/2004 | Huang | 330/253 |
| 6,930,545 | B2 * | 8/2005 | Kwan et al. | 330/9 |
| 7,078,968 | B2 * | 7/2006 | Gaeta et al. | 330/254 |
| 7,242,251 | B2 * | 7/2007 | Boos | 330/279 |

FOREIGN PATENT DOCUMENTS

JP    8-213855    8/1996

* cited by examiner

*Primary Examiner*—Henry K Choe
(74) *Attorney, Agent, or Firm*—McGinn Intellectual Property Law Group, PLLC

(57) ABSTRACT

A differential amplifier circuit includes an offset adjuster circuit for varying the active load to adjust the offset caused by the differential pair. The differential amplifier circuit includes fine adjustment cell sections including a plurality of transistors having the substantially same size, and shift cell sections including transistors, whose transistor size is larger than the transistors of the fine adjustment cell sections.

20 Claims, 4 Drawing Sheets

DIFFERENTIAL AMPLIFIER CIRCUIT HAVING OFFSET ADJUSTMENT CIRCUIT

INCORPORATION BY REFERENCE

This application is based upon and claims the benefit of priority from Japanese Patent Application No. 2008-131728 which was filed on May 20, 2008, the disclosure of which is incorporated herein in its entirety by reference.

BACKGROUND OF THE INVENTION

1. Field of the Invention

The present invention relates to a technology to adjust an offset voltage generated in a differential amplifier circuit.

2. Description of Related Art

In such a differential amplifier circuit, an offset voltage is generated in consequence of an inherent product characteristic of the transistors that constitute the differential pair. In most cases, an offset adjustment circuit is provided to cancel the offset voltage.

FIG. 5 shows an offset adjustment circuit, which includes multiple offset adjustment transistors 105a, 105b, 106a, 106b, and switches 107a, 107b, 108a, 108b connected in parallel with the transistors 102, 103 that constitute the active load on a differential amplifier circuit 101. This structure cancels out the offset voltage by switching the ON and OFF states of the switches 107a, 107b, 108a, 108b according to the offset voltage and selecting the transistors 105a, 105b, 106a, and 106b.

Japanese Patent Application Laid Open No. Hei 8(1996)-213855 shows an offset adjustment circuit including weighted transistors.

SUMMARY

The smaller the amount of offset adjustment (adjustment resolution capability) per each of the multiple transistors 105a, 105b, 106a, and 106b is, the more accurate the adjustment becomes available. However, the adjustable offset range becomes narrow because the fabrication area of the transistors is limited. Conversely, widening the adjustable offset range requires broadening the adjustment resolving power of the transistors 105a, 105b, 106a and 106b. Therefore, a highly accurate adjustment becomes difficult.

Japanese Patent Application Laid Open No. Hei 8(1996)-213855 shows a circuit that adjusts the offset by changing its active load using multiple weighted (possessing different adjustment resolution) transistors. The circuit requires such transistors with a large adjustment resolution for the offset adjustment when a large offset voltage is generated. Therefore, the circuit has a problem which requires a high accuracy adjustment, which is difficult.

A differential amplifier circuit including an offset adjuster circuit for varying the active load by adjusting the offset generated by the differential pair includes: a fine adjuster cell section including multiple transistors of an identical transistor size, and a shift cell section including transistors whose size is larger than the transistors in the fine adjuster cell section.

The aforementioned structure is capable of shifting the adjustable range of the fine adjuster cell section to match the offset level by setting the transistors in the shift cell section to a suitable connection status.

The present invention is capable of adjusting the offset with high-accuracy by way of the fine adjuster cell section even when an offset exceeding the adjustable range of the fine adjuster cell section has been generated. High accuracy and wide-ranging offset adjustments can therefore be made.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
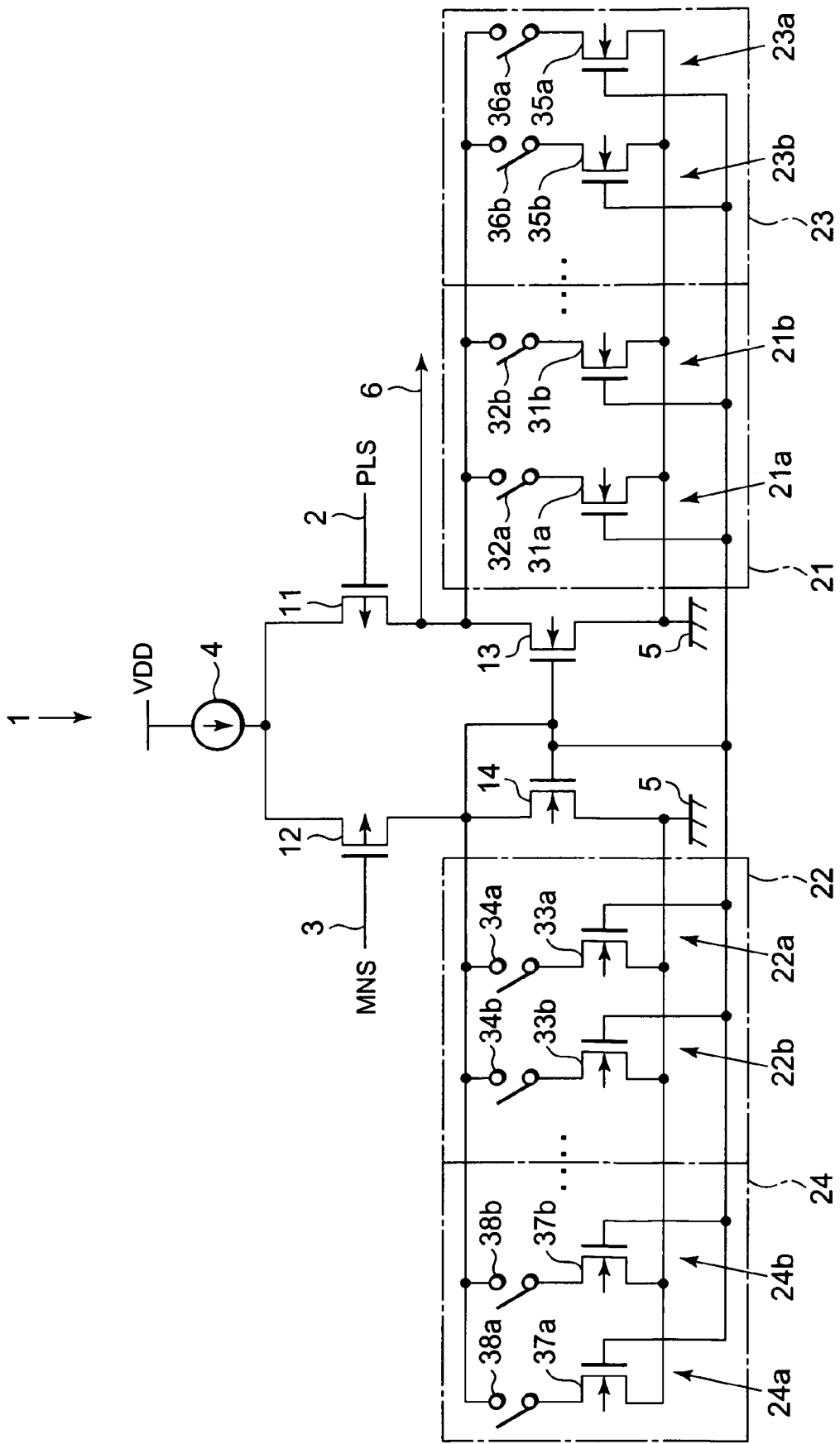
FIG. 1 illustrates a differential amplifier circuit of an exemplary embodiment of the present invention.

FIG. 1 shows a differential amplifier circuit 1 of an exemplary embodiment according to the present invention. The differential amplifier circuit 1 includes a plus input terminal 2, a minus input terminal 3, a positive power supply (fixed current power supply) 4, a negative power supply (ground voltage) 5, an output terminal 6, P-channel transistors 11, 12 that constitute a differential pair, N-channel transistors 13, 14 that constitute an active load, fine adjuster cell sections 21, 22, and shift cell sections 23, 24.

The fine adjuster cell section 21 includes multiple fine adjuster cells 21a, 21b that are connected in parallel with the N-channel transistor 13 on the plus input terminal 2 side. Each of the fine adjuster cells 21a, 21b is made up of fixed-resolution transistors 31a, 31b and the switches 32a, 32b. The fine adjuster cell section 22 is made up of multiple fine adjuster cells 22a, 22b connected in parallel with the N-channel transistor 14 on the minus input terminal 3 side. Each of the fine adjuster cells 22a, 22b is made up of the fixed-resolution transistors 33a, 33b and the switches 34a, 34b.

The shift cell section 23 includes multiple shift cells 23a, 23b connected in parallel with the N-channel transistor 13 (and each of the fine adjuster cells 21a, 21b) on the plus input terminal 2 side. Each of the shift cells 23a, 23b includes the weighted transistors 35a, 35b, and the switches 36a, 36b. The shift cell section 24 includes multiple shift cells 24a, 24b connected in parallel with the N-channel transistor 14 (and the fine adjuster cells 22a, 22b) on the minus input terminal 3 side. Each of the shift cells 24a, 24b includes the weighted transistors 37a, 37b, and the switches 38a, 38b.

Figure 2:
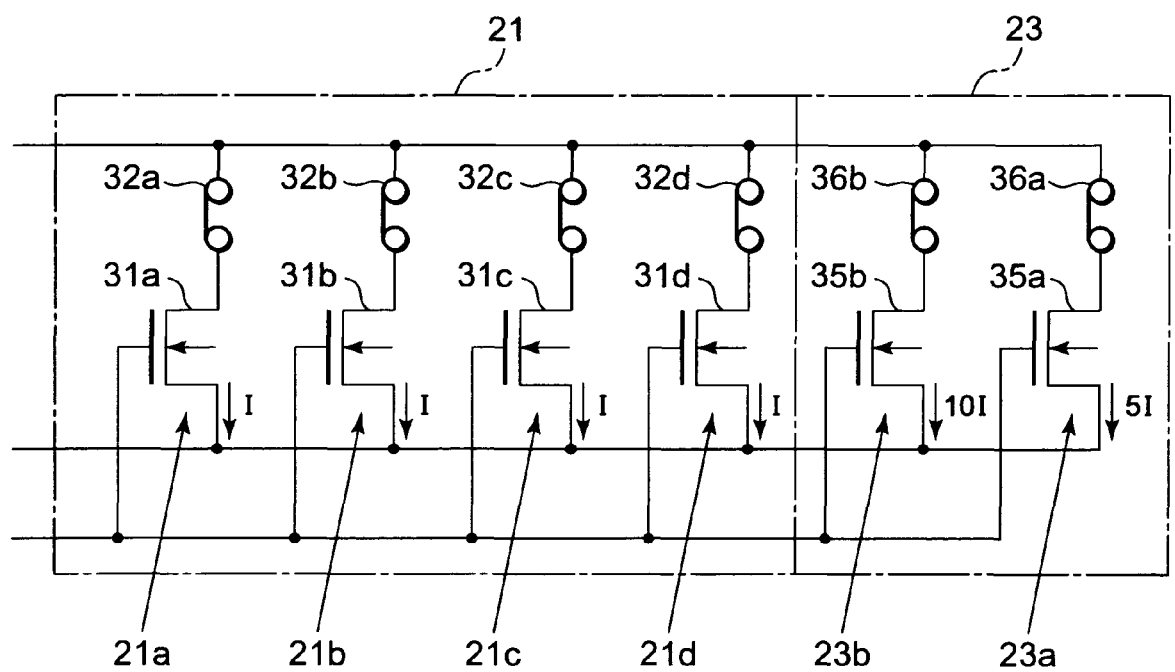
FIG. 2 illustrates a fine adjuster cell section and a shift cell section of the exemplary embodiment of the present invention.

FIG. 2 shows an example of the structure of the fine adjuster cell section 21 and the shift cell section 23. In this example, the fine adjuster cell section 21 includes four fine adjuster cells 21a, 21b, 21c, and 21d. The shift cell section 23 includes the two shift cells 23a and 23b. The number of the transistors in the sections 21, 23 is not limited to the example. The number of the transistors in the section can be changeable.

Each of the fixed-resolution transistors 31a, 31b, 31c and 31d in the fine adjuster cell section 21 is substantially the same size transistor (essentially identical).

Each of the weighted transistors 35a, 35b in the shift cell section 23 is a larger transistor size than the fixed-resolution transistors 31a, 31b, 31c, and 31d.

In this structure, different electrical current quantities flow in each of the transistors 31a, 31b, 31c, 31d, and 35a, 35b in a state where each of the switches 32a, 32b, 32c, 32d, and 36a, 36b is on. In this example, when an electrical current flowing in the fixed-resolution transistors 31a, 31b, 31c, and 31d is I, then an electrical current 5I flows in the first weighted transistor 35a and an electrical current 10I flows in the second weighted transistor 35b.

When each of the fixed-resolution transistors 31a, 31b, 31c, and 31d for example has an adjustment resolution of 0.2 mV, then the offset voltage adjustable only by the fine adjuster cell section 21 is 0.2×4=0.8 mV. The adjustment resolution of the first weighted transistor 35a then becomes 0.2×5=1.0 mV, and the adjustment resolution of the second weighted transistor 35b becomes 0.2×10=2.0 mV.

Figure 3:
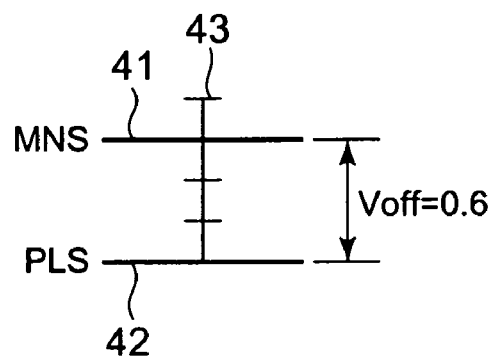
FIG. 3 illustrates an image of the offset voltage being adjusted by the fine adjuster cell.

FIG. 3 shows an image of the state when the fine adjuster cell section 21 adjusts the offset voltage Voff. The line 41 shows the voltage level on the MNS side, the line 42 shows the voltage level on the PLS side, and the scale 43 shows the width of the offset voltage capable of being adjusted by the fine adjuster cell section 21. One calibration on the scale 43 indicates 0.2 mV. This example is a state where an offset voltage Voff of 0.6 mV has occurred on the MNS side. This offset can be eliminated by adjusting three calibrations of the scale 43. In other words, this offset can be adjusted by setting three of the four switches 32a, 32b, 32c, and 32d (Refer to FIG. 2) of the fine adjuster cell section 21 to the on state (one switch is set to the off state).

Figure 4A:
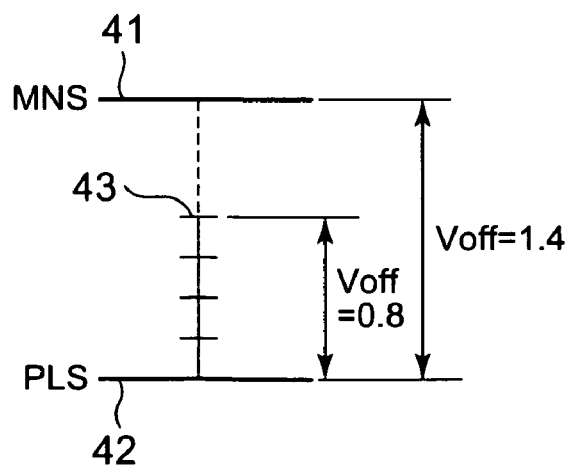
FIG. 4A illustrates an image of the state when the offset voltage exceeds the range adjustable by the fine adjuster cell section.
Figure 4B:
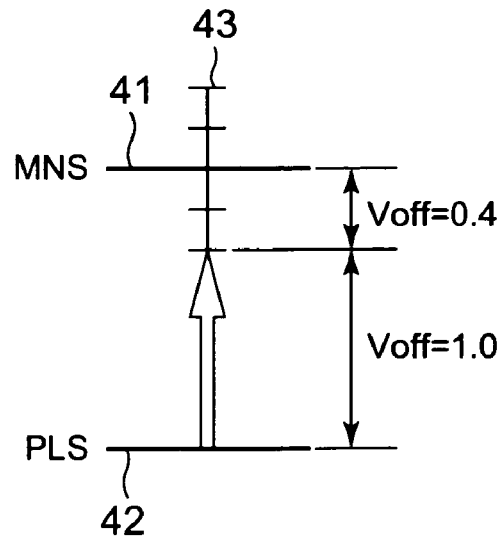
FIG. 4B illustrates an image of the state when the shift cell section shifted the range adjustable by the fine adjuster cell section in order to match the offset voltage.
Figure 5:
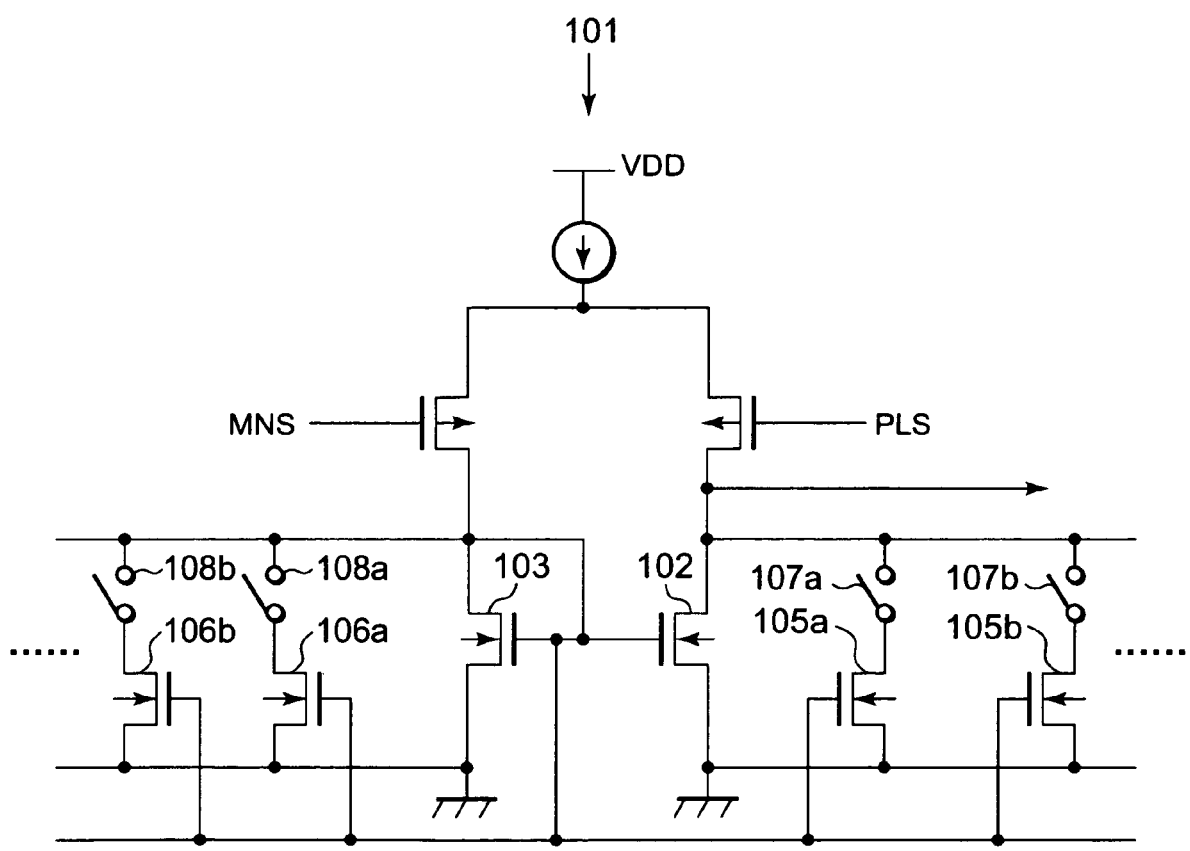
FIG. 5 illustrates a differential amplifier circuit of a related art.

However, when the offset voltage Voff is 0.8 mV or larger (in this case 1.4 mV) as shown in FIG. 4A, then such an offset cannot be adjusted only with the fine adjuster cell section 21. The range adjustable (scale 43) by the fine adjuster cell section 21 can be shifted by 1.0 mV to the MNS side as shown in FIG. 4B, by setting the switch 36a of the first weighted transistor 35a in the shift cell section 23 to the on state (setting switch 36b to off).

Therefore, even when the offset voltage Voff exceeds the range adjustable by the fine adjuster cell sections 21 or 22, the adjustment range of the fine adjuster cell sections 21 or 22 can be shifted by connecting the weighted transistors 35a, 35b or 37a, 37b of the shift cell sections 23 or 24 as needed to allow these fine adjuster cell sections 21 or 22 to make a fine offset adjustment.

The size of the transistors in the shift cell section 23, 24 is larger than the size of the transistors in the fine adjuster cell sections 21, 22. The weighted transistors 35a, 35b, 37a, 37b of shift cell sections 23, 24 therefore possess larger production variations than the fixed-resolution transistors 31a, 31b, 31c, and 31d of the fine adjuster cell sections 21, 22. The extent of the shift made by the weighted transistors 35a, 35b or 37a, 37b is also affected by those variations. However, the fixed resolution transistors 31a, 31b, 31c, 31d of the fine adjuster cell sections 21, 22 with their small transistor size or namely small variations are capable of providing fine offset adjustments and also high-accuracy adjustments. The size of the transistors in these fine adjuster cell sections 21, 22 is determined by the process variations, amount of required adjustment resolution, and the layout surface area. The cell sections 21, 22 may for example be constituted from transistors of a minimum size.

This invention is not limited to the above described exemplary embodiment and all manner of adaptations within the spirit and scope of this invention are allowed. In the above exemplary embodiment for example, the differential pair in the differential amplifier circuit was made up of the P-channel transistors 11, 12, and the offset adjuster cells 21 to 24 were made up of N-channel transistors. However, the present invention is also applicable to the case where the differential pair in the differential amplifier circuit is made up of N-channel transistors, and the offset adjuster cells is made up of P-channel transistors.

Further, it is noted that Applicant's intent is to encompass equivalents of all claim elements, even if amended later during prosecution.

What is claimed is:

1. A differential amplifier circuit including an offset adjusting circuit to adjust an offset generated by a differential pair, the offset adjusting circuit comprising:
    a fine adjustment cell section including a plurality of first transistors having substantially a same transistor size; and
    a shift cell section including a plurality of second transistors, each having a size greater than a size of each one of the plurality of first transistors of the fine adjustment cell section,
    wherein each of the plurality of first transistors comprises a fixed resolution transistor and each of the plurality of second transistors comprises a weighted transistor.

2. The differential amplifier circuit according to claim 1, wherein each transistor of the plurality of second transistors have different transistor sizes.

3. The differential amplifier circuit according to claim 1, wherein the plurality of first transistors includes a transistor which comprises a smallest transistor in a semiconductor device which is provided in the differential amplifier circuit.

4. A differential amplifier circuit, comprising:
    a transistor pair which constitutes a differential pair;
    a first offset adjustment circuit including a plurality of first transistors being substantially identical including with respect to a substantially same size, in order to adjust an offset produced by the transistor pair; and
    a second offset adjustment circuit including a plurality of second transistors which have a transistor size greater than the size of the first transistors, in order to adjust the offset produced by the transistor pair.

5. The differential amplifier circuit of claim 1, wherein each transistor of the plurality of first transistors has substantially a same adjustment resolution.

6. The differential amplifier circuit of claim 1, wherein each transistor of the plurality of first transistors has substantially a same variation in adjustment resolution.

7. The differential amplifier circuit of claim 1, wherein the fine adjustment cell section is provided for each side of the differential pair.

8. The differential amplifier circuit of claim 1, wherein the shift cell section is coupled to each side of the differential pair.

9. The differential amplifier circuit of claim 1, wherein the shift cell section and the fine adjustment cell section are both in parallel with the transistors of the differential pair, and
    wherein each of the first transistors are grouped in the fine adjustment cell section separate from a grouping of the second transistors in the shift cell section.

10. The differential amplifier circuit of claim 1, further comprising a switch coupled to each of the first transistors and each of the second transistors to selectively adjust the offset generated by the differential pair.

11. The differential amplifier circuit of claim 4, wherein each transistor of the plurality of first transistors has substantially a same adjustment resolution.

12. The differential amplifier circuit of claim 4, wherein each transistor of the plurality of first transistors has substantially a same variation in adjustment resolution.

13. The differential amplifier circuit of claim 4, wherein the first offset adjustment circuit is coupled to each transistor of the transistor pair.

14. The differential amplifier circuit of claim 4, wherein the second offset adjustment circuit is provided on each side of the transistor pair.

15. The differential amplifier circuit of claim 4, wherein the first and second offset adjustment circuits are in parallel with the transistor pair.

16. The differential amplifier circuit of claim 4, further comprising a switch coupled to each of the first transistors and each of the second transistors, to selectively adjust the offset generated by the transistor pair.

17. An offset adjusting circuit for a differential amplifier circuit including an offset adjusting circuit to adjust an offset generated by a differential pair, the offset adjusting circuit comprising:

a fine adjustment cell section on each side of the differential pair, each of the fine adjustment cell sections including a plurality of first transistors having substantially a same transistor size and substantially a same adjustment resolution; and a shift cell section on each side of the differential pair, each of the shift cell sections including a plurality of second transistors, each of the plurality of second transistors having a size greater than a size of each one of the plurality of first transistors of the fine adjustment cell section, wherein each transistor of the plurality of first transistors is a fixed resolution transistor and each transistor of the plurality of second transistors is a weighted transistor, and wherein the first transistors have less variation of adjustment resolution than the second transistors.

18. The offset adjusting circuit of claim 17, wherein each of the shift cell sections and the fine adjustment cell sections are in parallel with a corresponding transistor of the differential pair.

19. The offset adjusting circuit of claim 17, further comprising a switch coupled to each of the first transistors and each of the second transistors to selectively adjust the offset generated by the differential pair.

20. The offset adjusting circuit of claim 17, wherein each one of the first transistors is substantially identical.

* * * * *